United States Patent
Mokhlesi et al.

(10) Patent No.: US 8,406,063 B2
(45) Date of Patent: Mar. 26, 2013

(54) PROGRAMMING NON-VOLATILE STORAGE WITH SYNCHONIZED COUPLING

(75) Inventors: Nima Mokhlesi, Los Gatos, CA (US);
Henry Chin, Santa Clara, CA (US);
Masaaki Higashitani, Cupertino, CA (US)

(73) Assignee: SanDick Technologies Inc., Plano, TX (US)

( * ) Notice: Subject to any disclaimer, the term of this patent is extended or adjusted under 35 U.S.C. 154(b) by 0 days.

(21) Appl. No.: 13/590,155

(22) Filed: Aug. 20, 2012

(65) Prior Publication Data

US 2012/0314502 A1 Dec. 13, 2012

Related U.S. Application Data

(63) Continuation of application No. 12/785,636, filed on May 24, 2010, now Pat. No. 8,274,831.

(51) Int. Cl.
*G11C 11/34* (2006.01)

(52) U.S. Cl. ......... 365/185.28; 365/185.18; 365/185.14; 365/185.33

(58) Field of Classification Search ............. 365/185.18, 365/185.14, 185.28, 185.33
See application file for complete search history.

(56) References Cited

U.S. PATENT DOCUMENTS

| | | | |
|---|---|---|---|
| 5,991,202 A | 11/1999 | Derhacobian | |
| 6,049,494 A | 4/2000 | Sakui | |
| 6,061,270 A | 5/2000 | Choi | |
| 6,134,157 A | 10/2000 | Takeuchi | |
| 6,859,397 B2 | 2/2005 | Lutze | |
| 6,888,755 B2 * | 5/2005 | Harari | 365/185.02 |
| 7,020,026 B2 | 3/2006 | Guterman | |
| 7,023,733 B2 | 4/2006 | Guterman | |
| 7,117,296 B2 | 10/2006 | Hosono | |
| 7,158,418 B2 | 1/2007 | Chae | |
| 7,630,236 B2 | 12/2009 | Han | |
| 2004/0080980 A1 | 4/2004 | Lee | |
| 2007/0074194 A1 | 3/2007 | Hahn | |
| 2007/0109862 A1 | 5/2007 | Kim | |
| 2007/0236990 A1 | 10/2007 | Aritome | |
| 2009/0147569 A1 | 6/2009 | Kim | |

OTHER PUBLICATIONS

PCT International Search Report dated Jul. 21, 2011, PCT Patent Appl. No. PCT/US2011/037526.
PCT Written Opinion of the International Searching Authority dated Jul. 21, 2011, PCT Patent Appl. No. PCT/US2011/037526.
Notice of Allowance dated May 21, 2012, U.S. Appl. No. 12/785,636.

* cited by examiner

*Primary Examiner* — Jason Lappas
(74) *Attorney, Agent, or Firm* — Vierra Magen Marcus LLP

(57) ABSTRACT

A process for programming non-volatile storage is able to achieve faster programming speeds and/or more accurate programming through synchronized coupling of neighboring word lines. The process for programming includes raising voltages for a set of word lines connected a group of connected non-volatile storage elements. The set of word lines include a selected word line, unselected word lines that are adjacent to the selected word line and other unselected word lines. After raising voltages for the set of word lines, the process includes raising the selected word line to a program voltage and raising the unselected word lines that are adjacent to the selected word line to one or more voltage levels concurrently with the raising the selected word line to the program voltage. The program voltage causes at least one of the non-volatile storage elements to experience programming.

19 Claims, 14 Drawing Sheets

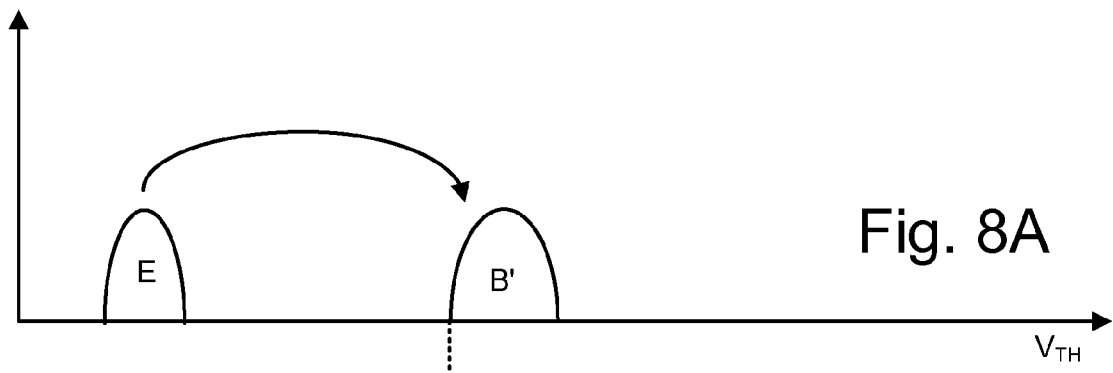
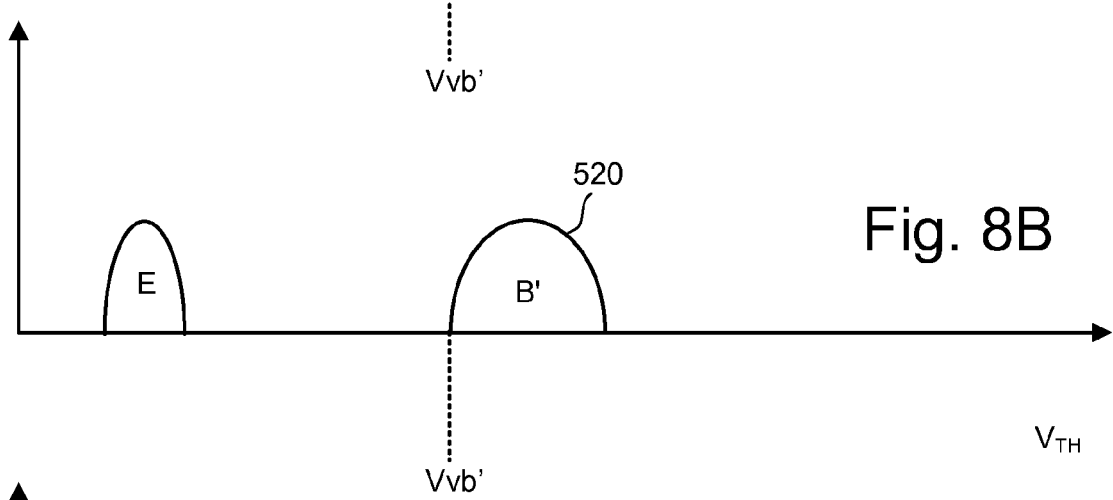
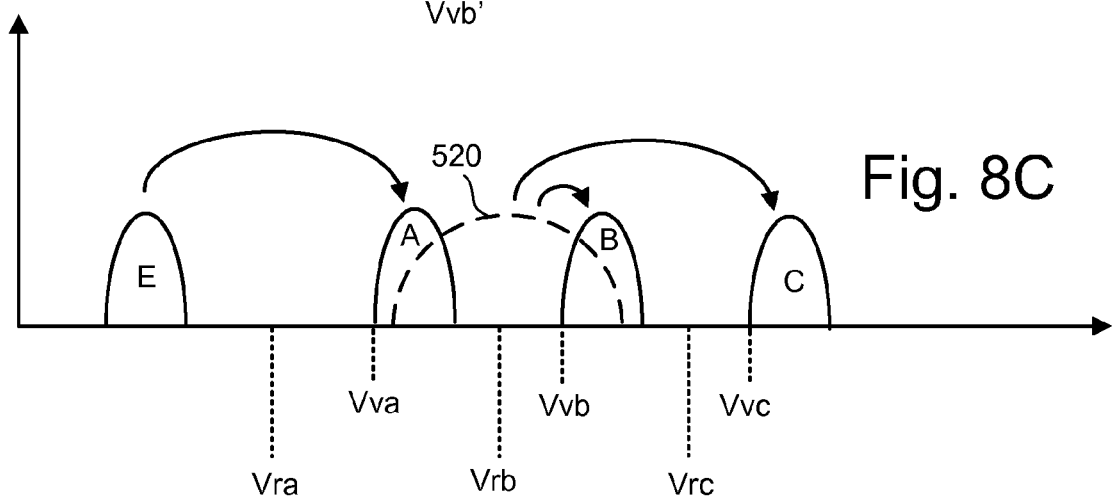
|  | State E | State A | State B | State C |
|---|---|---|---|---|
| Upper Page | 1 | 0 | 0 | 1 |
| Lower Page | 1 | 1 | 0 | 0 |
Fig. 9

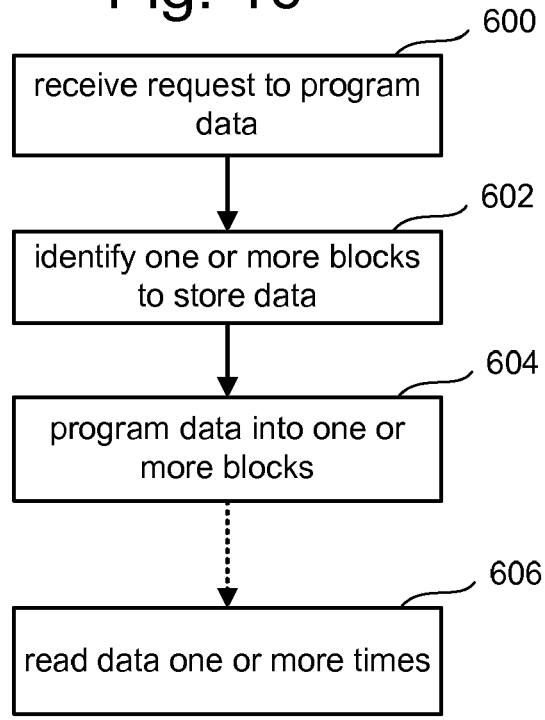
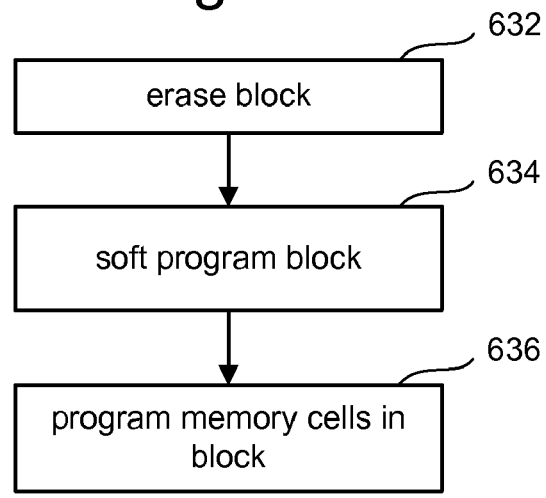

PROGRAMMING NON-VOLATILE STORAGE WITH SYNCHONIZED COUPLING

This application is a continuation application of U.S. patent application Ser. No. 12/785,636, "Programming Non-Volatile Storage With Synchronized Coupling," filed on May 24, 2010, by Mokhlesi, et al., incorporated herein by reference in its entirety.

BACKGROUND OF THE INVENTION

1. Field

The present invention relates to programming non-volatile storage.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. Pat. No. 6,859,397, titled "Source Side Self Boosting Technique For Non-Volatile Memory;" and in U.S. Pat. No. 6,917,542, titled "Detecting Over Programmed Memory," both patents are incorporated herein by reference in their entirety.

Some EEPROM and flash memory devices have a floating gate that is used to store two ranges of charges and, therefore, the memory cell can be programmed/erased between two states: an erased state and a programmed state that correspond to data "1" and data "0." Such a device is referred to as a binary device.

A multi-state flash memory cell is implemented by identifying multiple, distinct allowed threshold voltage ranges. Each distinct threshold voltage range corresponds to a predetermined value for the set of data bits. The specific relationship between the data programmed into the memory cell and the threshold voltage ranges of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells.

To apply the program voltage to the control gate of the cell being programmed, that program voltage is applied on the appropriate word line. In NAND flash memory, that word line is also connected to one cell in each of the NAND strings that utilize the same word line. A problem arises when it's desired to program one memory cell (or subset of memory cells) on a word line without programming other memory cells connected to the same word line. Because the program voltage is applied to all memory cells connected to a word line, an unselected cell (a memory cell that is not to be programmed) on the word line may become inadvertently programmed. The unintentional programming of the unselected memory cell on the selected word line is referred to as "program disturb."

Several techniques can be employed to prevent program disturb. In one method known as "self boosting," the unselected bit lines are electrically isolated and a pass voltage (e.g. 7-10 volts) is applied to the unselected word lines during programming. The unselected word lines couple to the unselected bit lines, causing a voltage to exist in the channel of the unselected bit lines, which tends to reduce program disturb. Self boosting causes a voltage boost to exist in the channel which tends to lower the voltage across the tunnel oxide and hence reduce program disturb.

Other techniques to avoid program disturb include Local Self Boosting ("LSB") and Erased Area Self Boosting ("EASB"). Both LSB and EASB attempt to isolate the channel of previously programmed memory cells from the channel of the memory cell being inhibited. With the LSB technique, the bit line for the memory cell being programmed is at ground and the bit line of the string with the memory cell being inhibited is at Vdd. The program voltage is driven on the selected word line. The word lines neighboring the selected word line are at zero volts and the remaining non-selected word lines are at Vpass. EASB is similar to LSB with the exception that only the source side neighbor word line is at zero volts. Revised Erased Area Self Boosting ("REASB") is a variation on EASB.

With each of the boosting and programming techniques, a signal needs to be driven on the word lines. In general, word lines have a non-negligible resistance and capacitance, thereby, leading to a significant RC time constant. Consequently, overall NAND Flash write speeds are degraded by the amount of time the system must wait for word lines to reach the targeted program voltages. If the system does not slow down the write process to fully accommodate the RC delay of the word lines, then the threshold voltage distribution of the memory cells being programmed at a given programming voltage ("natural Vt distribution") will experience a widening. Memory cells near the end of the word line that is connected to the driver typically have higher threshold voltages, while memory cells at the other end of the word line will have lower threshold voltages. Wider natural Vt distributions can have a number of detrimental effects, such as slower data programming, worse program disturb, or wider final programmed distributions.

BRIEF DESCRIPTION OF THE DRAWINGS

FIGS. 8A-8C depict examples of threshold voltage distributions and an example programming process.

FIG. 9 is a table showing one example of a relationship between threshold voltage distributions and data stored in memory cells.

FIG. 10 is a flow chart describing one embodiment of a process for operating non-volatile storage.

FIG. 11 is a flow chart describing one embodiment of a process for programming non-volatile storage.

DETAILED DESCRIPTION

A process is disclosed for programming non-volatile storage that is able to achieve faster programming speeds and/or more accurate programming through synchronized coupling of neighboring word lines. For example, an optimized waveform can be used for the selected word line (e.g., the word line connected to the one or more memory cells selected for programming) and the neighboring word lines that first raises those word lines to one or more intermediate level and then concurrently raises the selected word line and neighboring word lines to the respective target levels.

One example of a non-volatile storage system that can be used to implement the technology described herein is a flash memory system that uses the NAND structure, which includes arranging multiple transistors in series, sandwiched between two select gates. The transistors in series and the select gates are referred to as a NAND string.

Figure 1:
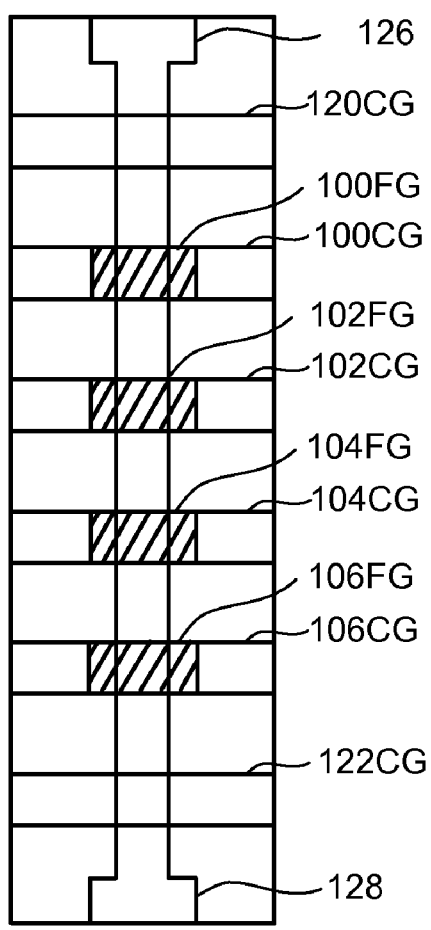
FIG. 1 is a top view of a NAND string.
Figure 2:
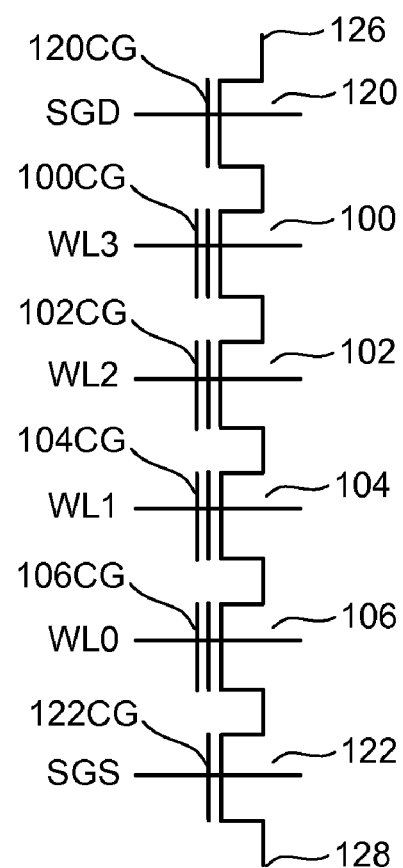
FIG. 2 is an equivalent circuit diagram of the NAND string.

FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (drain side) select gate 120 and a second (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Relevant examples of NAND type flash memories and their operation are provided in the following U.S. Patents/Patent Applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348.

Other types of non-volatile storage devices, in addition to NAND flash memory, can also be used. For example, non-volatile memory devices are also manufactured from memory cells that use a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Non-volatile storage based on MONOS or TANOS types of structures or nanocrystals can also be used. Other types of non-volatile storage can also be used.

Figure 3:
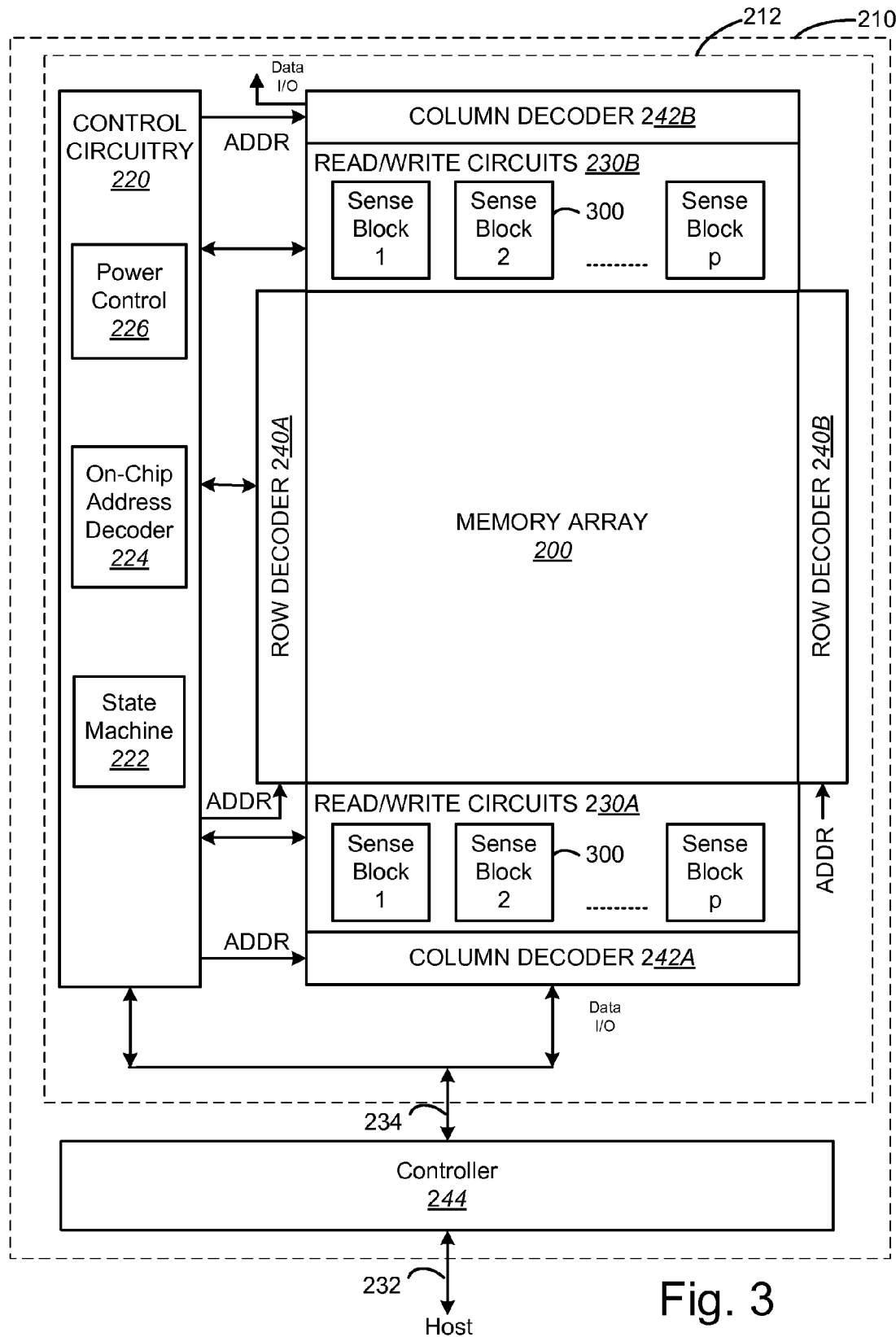
FIG. 3 is a block diagram of a non-volatile memory system.

FIG. 3 illustrates a memory device 210 having read/write circuits for reading and programming a page (or other unit) of memory cells (e.g., NAND multi-state flash memory) in parallel. Memory device 210 may include one or more memory die or chips 212. Memory die (or integrated circuit) 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. Word lines and bit lines are examples of control lines. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234.

Control circuitry 220 cooperates with the read/write circuits 230A and 230B to perform memory operations on the memory array 200. The control circuitry 220 includes a state machine 222, an on-chip address decoder 224, and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220 provides address lines ADDR to row decoders 240A and 204B, as well as column decoders 242A and 242B. Column decoders 242A and 242B provide data to controller 244 via the signal lines marked Data I/O. Temperature sensor 228 can be an analog or digital temperature sensor known in the art.

In one embodiment, controller 244 is implemented on a different die (or integrated circuit) than memory chip 212. In some embodiments, the controller 244 interfaces with the Host and with control circuitry 220 as well as the decoders. In some embodiments, controller 244 interfaces with the read/write circuits.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits. The one or more managing circuits perform the processes described herein.

Figure 4:
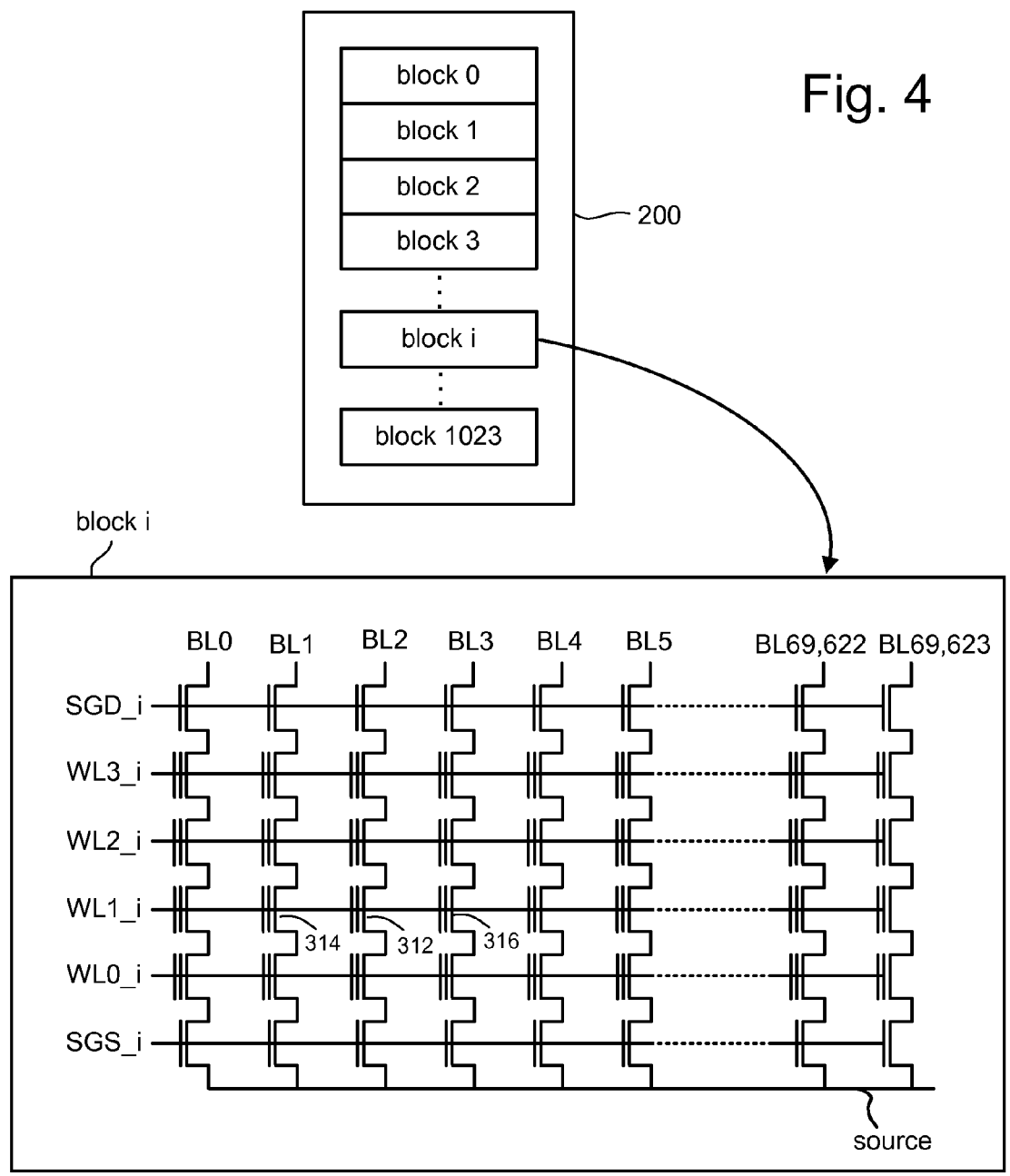
FIG. 4 is a block diagram depicting one embodiment of a memory array.

FIG. 4 depicts an exemplary structure of memory cell array 200. In one embodiment, the array of memory cells is divided into a large number of blocks (e.g., blocks 0-1023, or another amount of blocks) of memory cells. As is common for flash memory systems, the block is the unit of erase. That is, each block contains the minimum number of memory cells that are erased together. Other units of erase can also be used.

A block contains a set of NAND stings which are accessed via bit lines (e.g., bit lines BL0-BL69,623) and word lines (WL0, WL1, WL2, WL3). FIG. 4 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. A page can store one or more sectors. A sector includes user data and overhead data (also called system data). A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used. Additionally, a block can have more or less than 69,624 bit lines.

Figure 5:
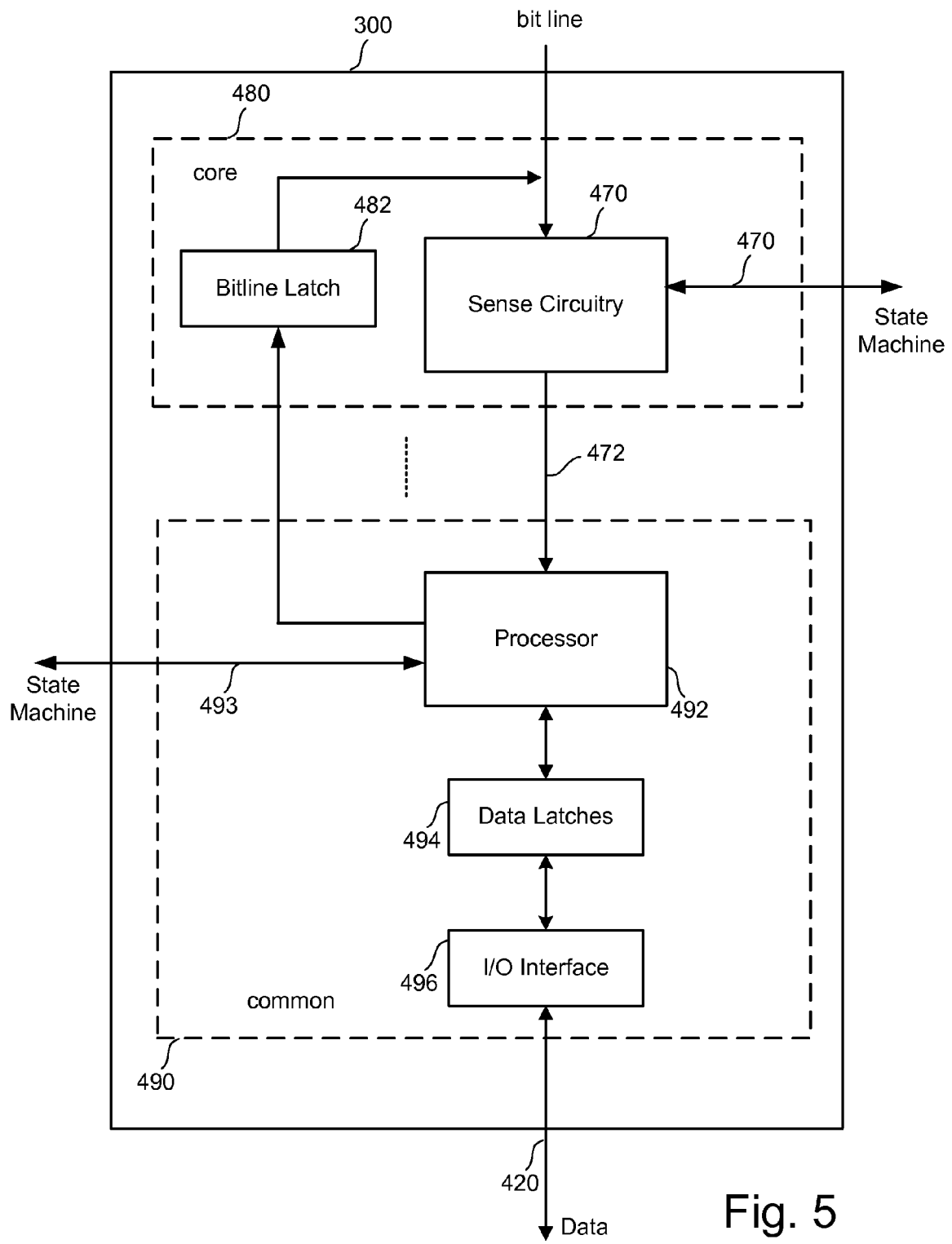
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. One example can be found in U.S. Patent Application Publication 2006/0140007, which is incorporated herein by reference in its entirety.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd) in order to lock out memory cells from programming.

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls (using power control 226) the supply of different control gate voltages to the addressed memory cell(s). As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

Data latch stack 494 contains a stack of data latches corresponding to the sense module. In one embodiment, there are three (or four or another number) data latches per sense module 480. In one embodiment, the latches are each one bit.

During program or verify, the data to be programmed is stored in the set of data latches 494 from the data bus 420. During the verify process, Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the sensing operations and sense amplifiers can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Publication 2006/0221692, titled "Compensating for Coupling During Read Operations of Non-Volatile Memory," Inventor Jian Chen, filed on Apr. 5, 2005; and (5) U.S. Patent Application Publication No. 2006/0158947, titled "Reference Sense Amplifier For Non-Volatile Memory," Inventors Siu Lung Chan and Raul-Adrian Cernea, filed on Dec. 28, 2005. All five of the immediately above-listed patent documents are incorporated herein by reference in their entirety.

Figure 6:
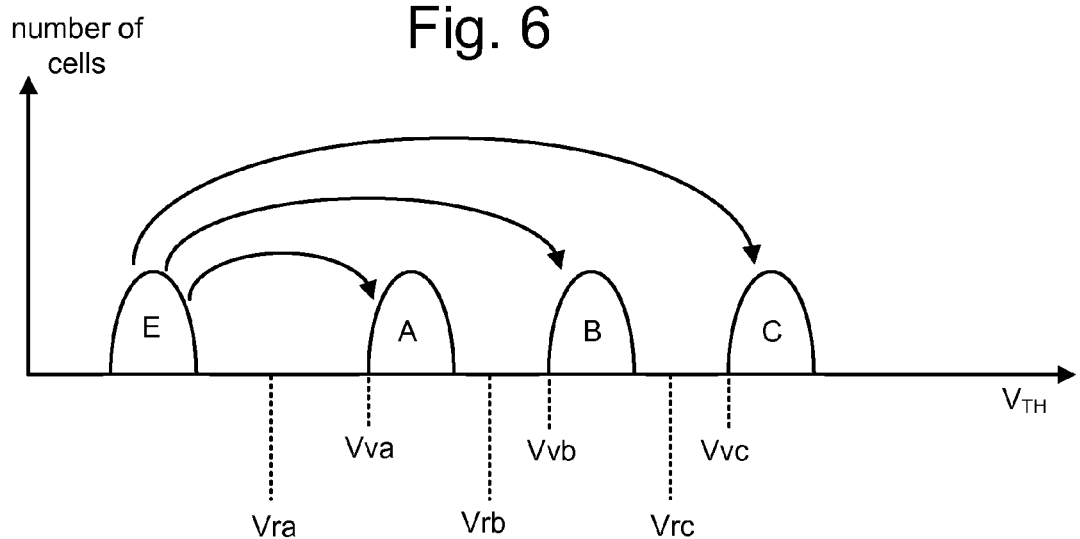
FIG. 6 depicts an example set of threshold voltage distributions and depicts an example programming process.

At the end of a successful programming process (with verification), the threshold voltages of the memory cells should be within one or more distributions of threshold voltages for programmed memory cells or within a distribution of threshold voltages for erased memory cells, as appropriate. FIG. 6 illustrates example threshold voltage distributions (corresponding to data states) for the memory cell array when each memory cell stores two bits of data. Other embodiments, however, may use more or less than two bits of data per memory cell (e.g., such as three, or four or more bits of data per memory cell). The technology described herein is not limited to any specific number of bits per memory cell.

FIG. 6 shows a first threshold voltage distribution E for erased memory cells. Three threshold voltage distributions A, B and C for programmed memory cells are also depicted. In one embodiment, the threshold voltages in the E distribution are negative and the threshold voltages in the A, B and C distributions are positive. Each distinct threshold voltage distribution of FIG. 6 corresponds to predetermined values for the set of data bits. The specific relationship between the data programmed into the memory cell and the threshold voltage levels of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 6 shows four states, the present invention can also be used with other multi-state structures including those that include more or less than four states.

FIG. 6 also shows three read reference voltages, Vra, Vrb and Vrc (also called read compare levels/values), for reading data from memory cells. By testing whether the threshold voltage of a given memory cell is above or below Vra, Vrb and Vrc, the system can determine what state the memory cell is in. For example, if a memory cell has a threshold voltage less than Vra, it is assumed to be in state E. If a memory cell has a threshold voltage less than Vrb amd greater than Vra, it is assumed to be in state A. If a memory cell has a threshold voltage less than Vrc amd greater than Vrb, it is assumed to be in state B. If a memory cell has a threshold voltage greater than Vrc, it is assumed to be in state C.

FIG. 6 also shows three verify reference voltages, Vva, Vvb and Vvc (also called verify compare values/levels). When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

In one embodiment, known as full sequence programming, memory cells can be programmed from the erase state E directly to any of the programmed states A, B or C. For example, a population of memory cells to be programmed may first be erased so that all memory cells in the population are in erased state E. Then, a programming process is used to program memory cells directly into states A, B or C. While some memory cells are being programmed from state E to state A, other memory cells are being programmed from state E to state B and/or from state E to state C.

Figure 7:
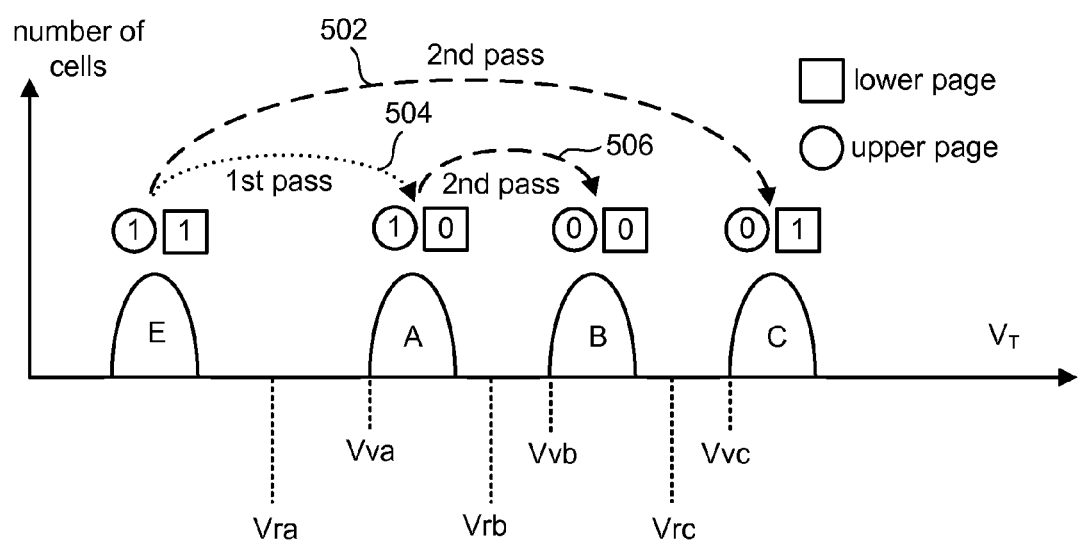
FIG. 7 depicts an example set of threshold voltage distributions and depicts an example programming process.

FIG. 7 illustrates one example of a two-stage technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming stage, the memory cells' threshold voltages levels are set according to the bit to be programmed into the lower logical page. If that bit is a logic "1," the threshold voltage is not changed since the respective memory cell is in the appropriate state as a result of having been earlier erased. However, if the bit to be programmed is a logic "0," the threshold level of the cell is increased to be state A, as shown by arrow 504. That concludes the first programming stage.

In a second programming stage, the memory cell's threshold voltage level is set according to the bit being programmed into the upper logical page. If the upper logical page bit is to store a logic "1," then no programming occurs since the memory cell is in one of states E or A, depending upon the programming of the lower page bit, both of which carry an upper page bit of "1." If the upper page bit is to be a logic "0," then the threshold voltage is shifted. If the first stage resulted in the memory cell remaining in the erased state E, then in the second stage the memory cell is programmed so that the threshold voltage is increased to be within state C, as depicted by arrow 502. If the memory cell had been programmed into state A as a result of the first programming stage, then the memory cell is further programmed in the second stage so that the threshold voltage is increased to be within state B, as depicted by arrow 506. The result of the second stage is to program the memory cell into the state designated to store a logic "0" for the upper page without changing the data for the lower page.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. Patent Application 2006/0126390, incorporated herein by reference in its entirety.

FIGS. 8A-C describe another multi-stage programming process for programming non-volatile memory. The process of FIGS. 8A-C reduces floating gate to floating gate coupling by, for any particular memory cell, writing to that particular memory cell with respect to a particular page subsequent to writing to adjacent memory cells for previous pages. In one example of an implementation of the process taught by FIGS. 8A-C, the non-volatile memory cells store two bits of data per memory cell, using four data states. For example, assume that state E is the erased state and states A, B and C are the programmed states. FIG. 9 shows one example of the relationship between states and data stored. State E stores data 11. State A stores data 01. State B stores data 00. State C stores data 10 This is an example of Gray coding. Other encodings of data to physical data states can also be used. Each memory cell stores two pages of data. For reference purposes, these pages of data will be called upper page and lower page; however, they can be given other labels. With reference to state A for the process of FIGS. 8A-C, the upper page stores data 0 and the lower page stores data 1. With reference to state B, both pages stores data 0. With reference to state C, the lower pages stores data 0 and the upper page stores data 1.

The programming process of FIGS. 8A-C is a two-stage programming process; however, the process of FIGS. 8A-C can be used to implement a three stage process, a four stage process, etc. In the first stage, the lower page is programmed. If the lower page is to remain data 1, then the memory cell state remains at state E. If the lower page data is to be programmed to 0, then the threshold of voltage of the memory cell is raised such that the memory cell is programmed to state B'. FIG. 8A shows the programming of memory cells from state E to state B'. State B' depicted in FIG. 8A is an interim state B; therefore, the verify point is depicted as Vvb', which is lower than Vvb.

In one embodiment, after a memory cell is programmed from state E to state B', its neighbor memory cell (on word line WLn+1) in the NAND string will then be programmed with respect to its lower page. After programming the neighbor memory cell, the floating gate to floating gate coupling effect may raise the apparent threshold voltage of earlier programmed memory cell. This will have the effect of widening the threshold voltage distribution for state B' to that depicted as threshold voltage distribution 520 of FIG. 8B. This apparent widening of the threshold voltage distribution will be remedied when programming the upper page.

FIG. 8C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 520 and the upper page data is to remain at 1, then the memory cell will be programmed to final state C. If the memory cell is in intermediate threshold voltage distribution 520 and the upper page data is to become data 0, then the memory cell will be to state B. The process depicted by FIGS. 8A-C reduces the effect of floating gate to floating gate coupling because only the upper page programming of neighbor memory cells will have an effect on the apparent threshold voltage of a given memory cell.

Although FIGS. 8A-C provide an example with respect to four data states and two pages of data, the concepts taught by FIGS. 8A-C can be applied to other implementations with more or less than four states and different than two pages. More details about the programming process of FIGS. 8A-C can be found in U.S. Pat. No. 7,196,928, incorporated herein by reference.

FIG. 10 is a flow chart describing one embodiment of a process for operating non-volatile memory, such as the system of FIG. 3 (or other systems). In step 600, a request to program data is received. The request can be from a host, another device or the controller. The request can be received at the controller, control circuitry, state machine, or other device. In response to the request, the controller, control circuitry, state machine, or other component will determine which block of flash memory cells will be used to store the data in step 602. The data will be programmed into the determined block using any of the programming processes described above (or other programming processes) in step 604. The programmed data will be read one or many times in step 606. There is a dashed line between steps 604 and 606 because an unpredictable amount of time may pass between the steps, and step 606 is not performed in response to step 604. Rather, step 606 is performed in response to a request to read the data or other event.

FIG. 11 is a flow chart describing a programming process for programming memory cells in a block. The process of FIG. 11 is one embodiment of step 604 of FIG. 10. In step 632, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. A strong electric field is, thus, applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of the selected memory cells is lowered. Erasing can be performed on the entire memory array, on individual blocks, or another unit of cells. Other techniques for erasing can also be used.

In step 634, soft programming is performed to narrow the threshold voltage distribution of the erased memory cells. Some memory cells may be in a deeper erased state than necessary as a result of the erase process. Soft programming can apply programming pulses to move the threshold voltage of the deeper erased memory cells to a higher threshold voltage that is still in a valid range for the erased state. In step 636, the memory cells of the block are programmed as described herein. The process of FIG. 11 can be performed at the direction of the state machine, controller or combination of state machine and controller, using the various circuits described above. For example, the controller may issue commands and data to the state machine to program the data. In response, the state machine may operate the circuits described above to carry out the programming operations.

Figure 12:
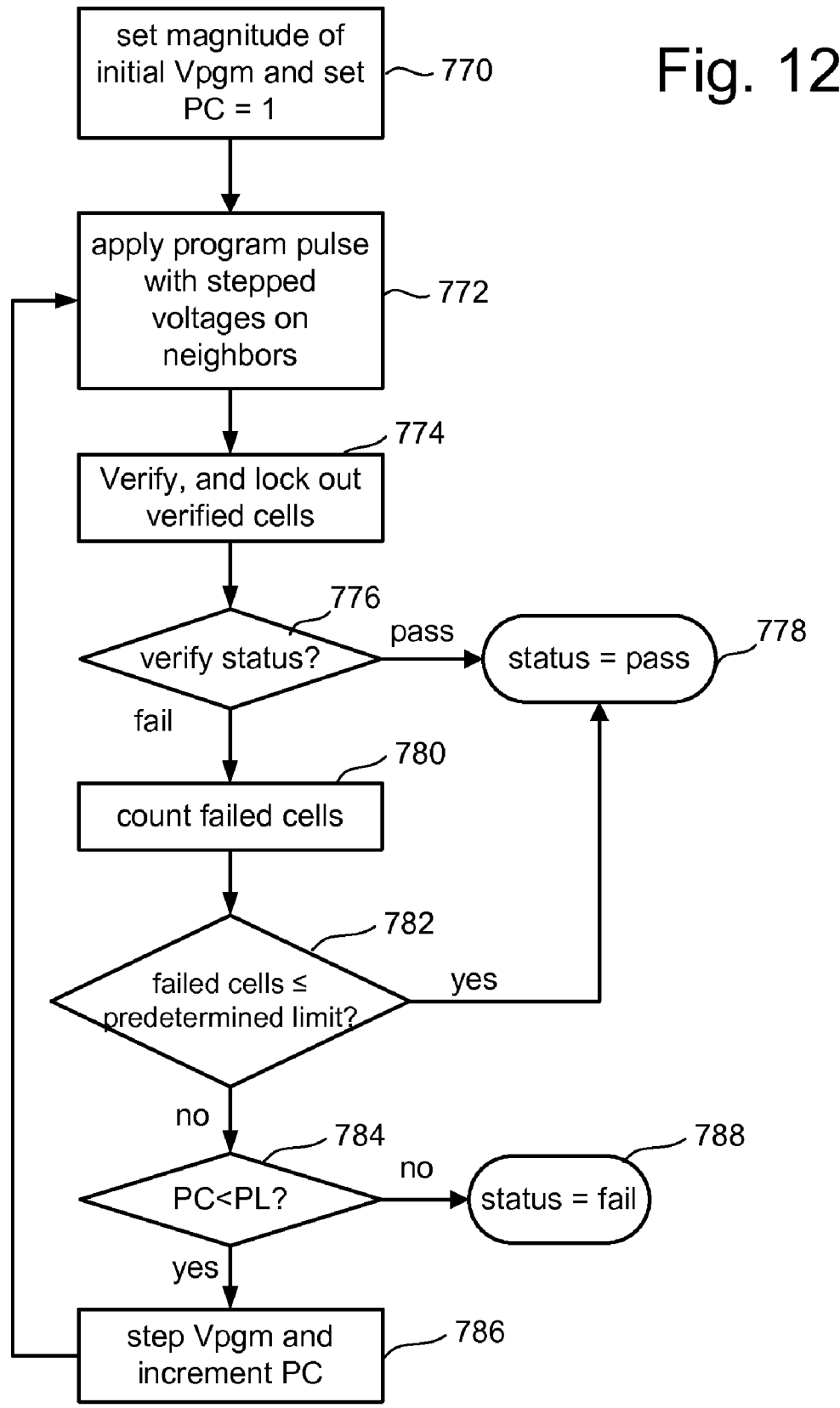
FIG. 12 is a flow chart describing one embodiment of a process for performing programming operations for non-volatile storage.

FIG. 12 is a flow chart describing one embodiment of a process for performing programming on one or more memory cells connected to a common word line. Therefore, when programming a block of memory cells the process of FIG. 12 is performed one or more times for each word line of the block. The process of FIG. 12 can be performed one or multiple times during step 636 of FIG. 11. For example, the process of FIG. 12 can be used to program memory cells (e.g., full sequence programming) from state E directly to any of states A, B or C. Alternatively, the process of FIG. 12 can be used to perform one or each of the stages of the process of FIG. 7, FIGS. 8A-C, or other programming schemes. For example, when performing the process of FIGS. 8A-C, the process of FIG. 12 is used to implement the first stage that includes programming some of the memory cells from state E to state B'. The process of FIG. 12 can then be used again to implement the second stage that includes programming some of the memory cells from state E to state A and from state B' to states B and C.

Typically, the program voltage applied to the control gate during a program operation is applied as a series of program pulses. Between programming pulses are a set of one or more verify pulses to perform verification. In many implementations, the magnitude of the program pulses is increased with each successive pulse by a predetermined step size. In step 770 of FIG. 12, the programming voltage (Vpgm) is initialized to the starting magnitude (e.g., ~12-16V or another suitable level) and a program counter PC maintained by state machine 222 is initialized at 1.

In step 772, a program pulse of the program signal Vpgm is applied to the selected word line (the word line selected for programming). In one embodiment, the group of memory cells being programmed are all connected to the same word line (the selected word line). The unselected word lines receive one or more boosting voltages (e.g., ~9 volts) to perform boosting schemes known in the art in order to avoid program disturb. There are many different boosting schemes that can be used with the technology described herein. To provide the boosting voltages on the unselected word lines, step 772 includes stepping the voltages of the neighboring unselected word lines. That is, the unselected word lines that are next to the selected word line will first be raised to one or more intermediate voltages and then subsequently raised to their one or more target boosting voltages. The program voltage will also be raised first to an intermediate voltage and then to the target program voltage concurrently with the neighboring unselected word lines. More details are provided with respect to FIGS. 13-17.

In one embodiment, if a memory cell should be programmed, then the corresponding bit line is grounded. On the other hand, if the memory cell should remain at its current threshold voltage, then the corresponding bit line is connected to Vdd to inhibit programming. In step 772, the program pulse is concurrently applied to all memory cells connected to the selected word line so that all of the memory cells connected to the selected word line that should be programmed are programmed concurrently. That is, they are programmed at the same time (or during overlapping times). In this manner all of the memory cells connected to the selected word line will concurrently have their threshold voltage change, unless they have been locked out from programming. In step 774, the appropriate memory cells are verified using the appropriate set of target levels to perform one or more verify operations. If a memory cell is verified to have reached its target, it is locked out from further programming. One embodiment for locking out a memory cell from further programming is to raise the corresponding bit line voltage to, for example, Vdd.

In step 776, it is determined whether all the memory cells have reached their target threshold voltages. If so, the programming process is complete and successful because all selected memory cells were programmed and verified to their target states. A status of "PASS" is reported in step 778. If, in 776, it is determined that not all of the memory cells have reached their target threshold voltages, then the programming process continues to step 780.

In step 780, the system counts the number of memory cells that have not yet reached their respective target threshold voltage distribution. That is, the system counts the number of memory cells that have failed the verify process. This counting can be done by the state machine, the controller, or other logic. In one implementation, each of the sense blocks 300 (see FIG. 3) will store the status (pass/fail) of their respective memory cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. More information can be found in United States Patent Publication 2008/0126676, incorporated herein by reference in its entirety. In another alternative, each of the sense amplifiers can output an analog voltage or current if its corresponding memory cell has failed and an analog voltage or current summing circuit can be used to count the number of memory cells that have failed. In one embodiment, there is one total counted, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782. In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed, temperature or other criteria.

If the number of failed cells is not less than the predetermined limit, than the programming process continues at step 784 and the program counter PC is checked against the program limit value (PL). One example of a program limit value is 20; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line.

During verify operations (e.g., step 774) and read operations, the selected word line is connected to a voltage, a level of which is specified for each read operation (e.g., Vra, Vrb, and Vrc,) or verify operation (e.g. Vva, Vvb, and Vvc) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287; (2) United States Patent Application Pub No. 2004/0109357; (3) U.S. Patent Application Pub. No. 2005/0169082; and (4) U.S. Patent Application Pub. No. 2006/0221692. The erase, read and verify operations described above are performed according to techniques known in the art. Thus, many of the details explained can be varied by one skilled in the art. Other erase, read and verify techniques known in the art can also be used.

Figure 13:
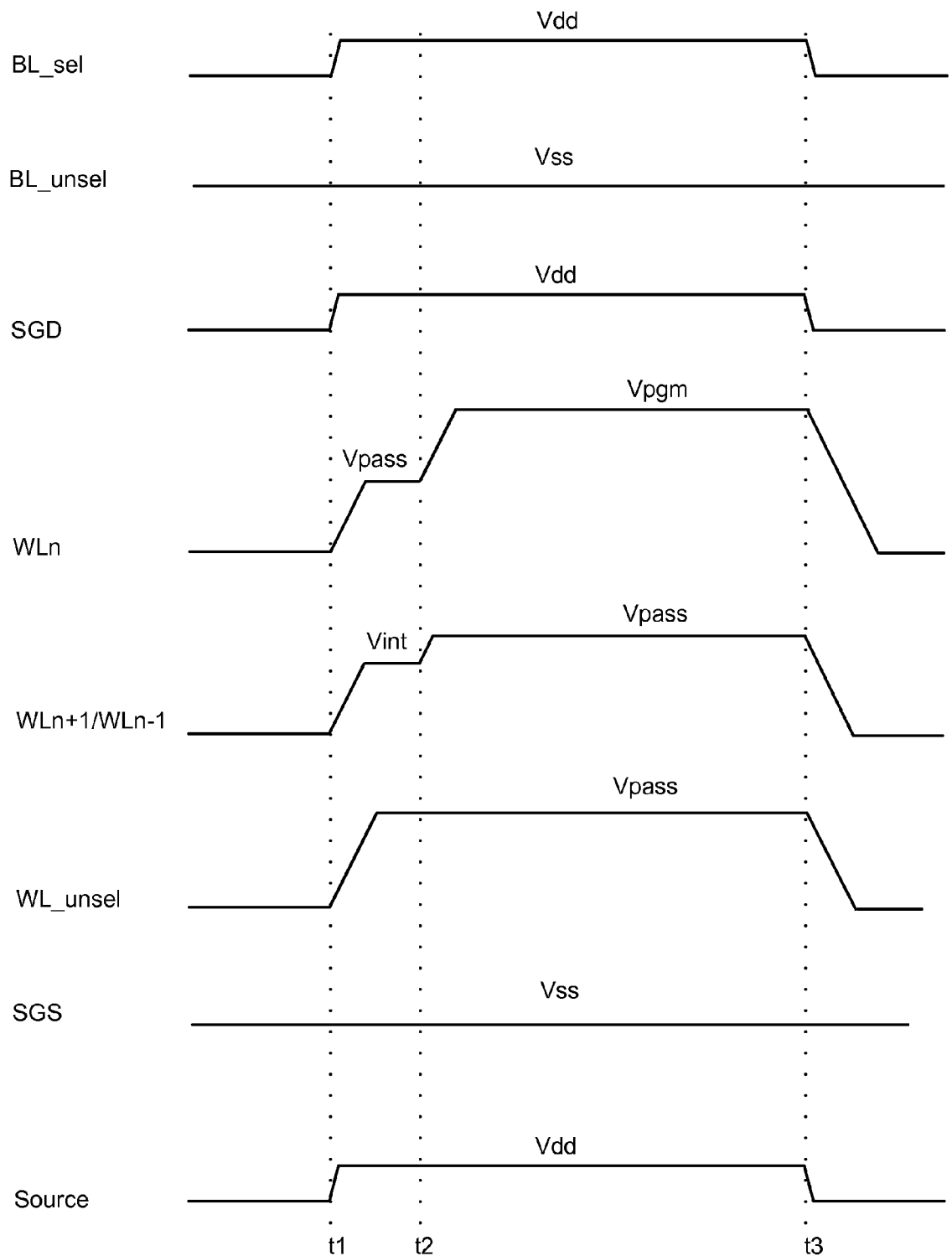
FIGS. 13-17 are timing diagrams that describe the behavior of various signals when applying a programming pulse for various embodiments.

FIG. 13 is a timing diagram that depicts the behavior of various signals during step 772 of the process depicted in FIG. 12. That is, the timing diagram shows the application of a programming pulse on the selected word line and the boosting voltages on the unselected word lines. FIG. 13 shows eight signals: BL_sel, BL_unsel, SGD, WLn, WLn+1/WLn−1, WL_unsel, SGS, and Source. As discussed above, the programming process of FIG. 12 is used to program memory cells along one particular word line. It is contemplated that in any programming process, some of the memory cells connected to the selected word line will be selected for programming and some of the memory cells connected to the selected word line will not be selected for programming. The signal BL_sel is the voltage on the bit lines for those memory cells that are selected for programming. The signal BL_unsel is the bit line voltage for those memory cells that are not selected for programming. SGD is the drain side select gate signal. SGS is the source side select gate signal. WLn is the voltage on the word line selected for programming. WLn+1/WLn−1 are the two word lines that are neighbors to the WLn. That is, WLn+1 is next to WLn on one side of WLn and WLn−1 is next to WLn on the other side of WLn. For example if the word line selected for programming is word line WL2, then the neighboring word lines are word lines WL1 and WL3. The signal WL_unsel are those word lines that are not selected for programming other than the neighboring word lines. Source is the common source line (See FIG. 4).

The process of FIG. 13 starts with all the displayed signals at zero volts. At time t1, BL_sel is raised to VDD (e.g., 3-5 volts) BL_unsel remains at Vss (zero volts), SGD is raised to VDD, SGS remains at Vss, and the Source line is raised to VDD. Also at t1, the voltages for all the word line lines are raised to one or more different levels. In the embodiment of FIG. 13, WLn is raised to Vpass (e.g., approximately 9 volts; however, other values can be used), the neighboring word lines WLn+1/WLn−1 are raised to Vint (an intermediate voltage that is typically lower than Vpass), and the other unselected word lines WL_unsel are raised to Vpass. In one embodiment, Vint is lower than Vpass by a constant value (herein referred to as Δ). In one example Δ=2 volts. After the raising of various word line voltages at t1, those voltages are held for a finite period of time at the respective levels discussed above.

As discussed above, at each cycle of the programming process of FIG. 12, the magnitude of Vpgm increases. In some embodiments, Vpass will stay constant throughout the programming process. In other embodiments, Vpass will increase with each increment of Vpgm. In some embodiments, Δ will remain constant so that Vint will increase as Vpass increases in each of the cycles that make up the programming process. In other embodiments, Vint will remain constant as Vpass increases in each of the cycles that make up the programming process.

At time t2, the selected word line WLn will be raised from Vpass to Vpgm. Also at t2, the neighboring word lines WLn+1/WLn−1 will have their voltages raised from Vint to Vpass. In one embodiment, WLn+1/WLn−1 are raised concurrently with raising the voltage on WLn. The use of the term concurrently means that the raising voltages on the neighboring word lines overlaps in time with the raising of the voltage on the selected word line; however, the raising of voltage on the neighboring word lines may start or end at different times than the raising of the voltage of the selected word line. Between t2 and t3 is the application of the program pulse. At time t3, the signals BL_sel, SGD, WLn, WLn+1/WLn−1, WL_unsel, and Source are lowered to zero volts.

Because of the rising edge transition on neighboring word lines WLn+1/WLn−1 at t2, these neighboring word lines will provide a capacitive coupling to WLn which results in a capacitive boost to WLn. This capacitive boost allows WLn to reach its target voltage more quickly. Therefore, memory cells on the opposite side of a word line from the word line driver rise more rapidly. Because the neighboring word lines are raised to an acceptable pass voltage (e.g., Vpass), the impact of program disturb is minimized. Additionally, as the selected word line is raised to Vpass at time t1, rather than Vint, the selected word line will reach the target Vpgm more quickly.

In one embodiment, the word line drivers for neighboring word lines will be placed on alternate sides of the block. For example, all even numbered word lines will have the word line drivers positioned on the left side while all odd numbered word lines have the word line drivers positioned on the right side. This will improve the benefit of the capacitive coupling discussed above.

The above described implementation, using the capacitive coupling of neighboring word lines, can allow for faster programming. For example, the width of the program pulse can be shortened without increasing the natural Vt distribution. In some embodiments, all the word line drivers will still be on the same side of the memory array.

Note that it may be possible that the neighboring word lines WLn+1 and WLn−1 can be driven to different intermediate voltages rather than the same intermediate voltage; they may also be driven to different Vpass voltages at time t2. Similarly, the other unselected word lines (WL_unsel) do not all need to be raised to the same Vpass. Each of these word lines can also be raised to variations of Vpass.

In the discussion above, the set of neighboring word lines include one neighboring word line on each side of the selected word line. In another embodiment, the set of neighboring word lines can include two or more word lines on each side of the selected word line so that the signal WLn+1/WLn−1 would apply to WLn+1, WLn+2, WLn−1 and WLn−2. In other embodiments, a set of neighboring word lines can be more than two word lines on each side of the selected word line.

The application of the program voltage on the selected word line WLn causes the one or more selected memory cells to experience programming. Similarly, the use of the various boosting signals (e.g. Vpass) works to reduce program disturb and, therefore, support the programming.

Figure 14:
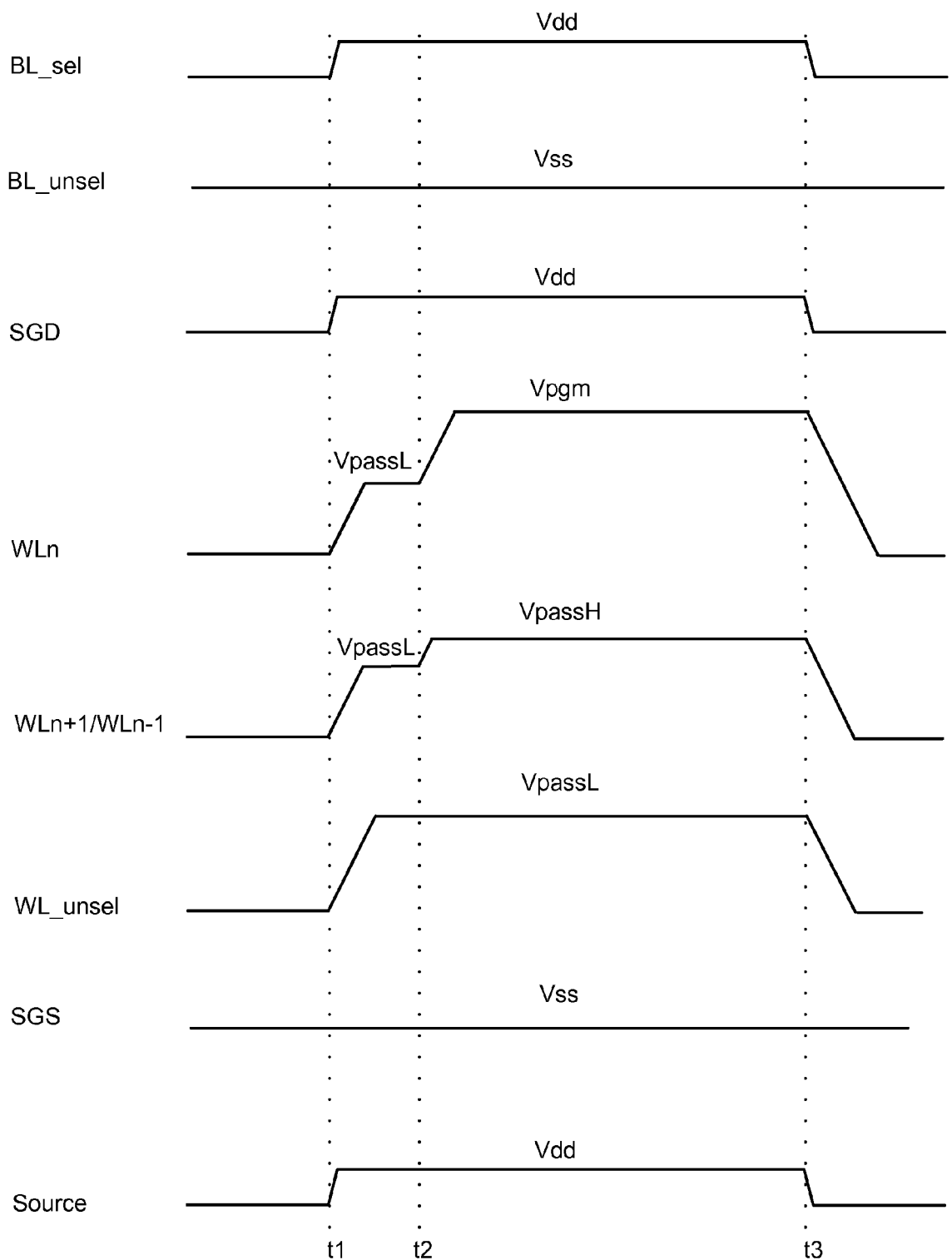

FIG. 14 is a timing diagram that depicts the behavior of the various signals during another embodiment of step 772 of the process depicted in FIG. 12. That is, the timing diagram of FIG. 14 is another embodiment of applying a programming pulse on the selected word line and the boosting voltages on the unselected word lines. The signals BL_sel, BL_unsel, SGD, SGS, and Source behave in the same manner as in FIG. 13. In the embodiment of FIG. 14, the selected word line WLn, the neighboring word line is WLn+1/WLn−1 and the other unselected word lines WL_unsel are all raised to VpassL at time t1. The other unselected word lines WL_unsel will remain at VpassL until t3. At time t2, the selected word line WLn is raised to Vpgm for that particular cycle and the neighboring word lines WLn+1/WLn−1 are raised to Vpass H. Vpass H is analogous to Vpass of FIG. 13 and Vpass L is analogous to Vint of FIG. 13. A difference between the process of FIG. 14 and the process of FIG. 13, is that in FIG. 13 the other unselected word lines WL_unsel were raised to the higher pass voltage at time t1. In the embodiment of FIG. 14, the other unselected word lines are raised to the lower pass voltage (Vpass L) and remain there during the programming pulse. One advantage of the environment of FIG. 14 is that the other unselected word lines will use less power.

Figure 15:
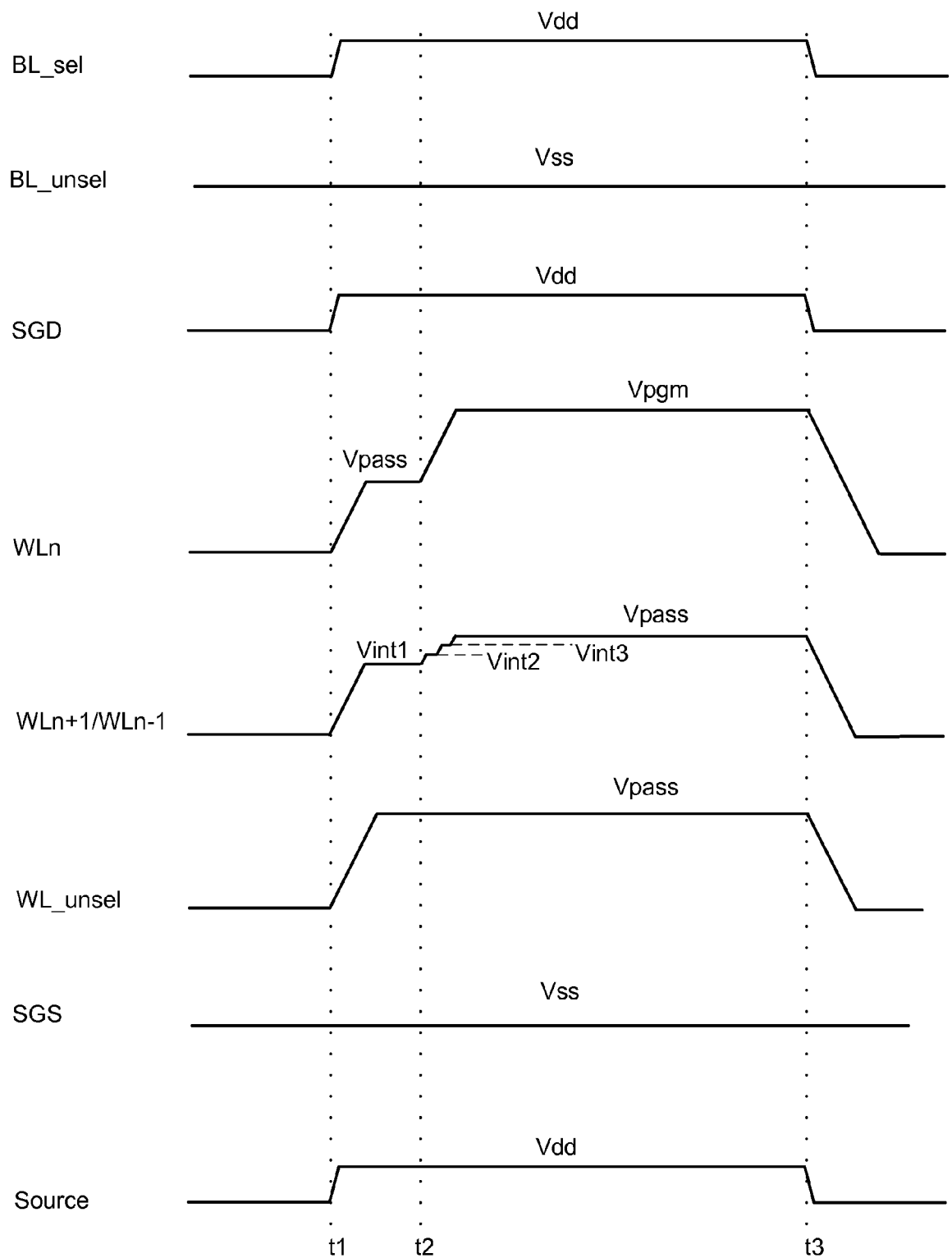

FIG. 15 is a timing diagram that depicts the behavior of various signals during another embodiment of step 772 of the process depicted in FIG. 12. That is the timing diagram of FIG. 15 shows the application of a programming pulse on the selected word line and the boosting voltages on the unselected word lines during another embodiment. The signals BL_sel, BL_unsel, SGD, SGS, Source, WLn and WL_unsel behave in the same manner as in FIG. 13. The difference between FIG. 15 and FIG. 13 is the behavior of the neighboring word lines WLn+1/WLN−1. In FIG. 15, the neighboring word lines will be raised from Vint to Vpass in steps, with the voltage being held for a finite period of time at each step. For example, at time t1, the neighboring word lines WLn+1/WLn−1 are raised from zero volts to Vint 1 (the first intermediate voltage). At time t2, the neighboring word lines will be raised from Vint 1 up to Vpass by first raising the voltage on the neighboring word lines to Vint 2 (the second intermediate voltage), holding the voltage at Vint 2 for a finite period of time, then raising the voltage to Vint 3 (the third intermediate voltage), holding the voltage at Vint 3 for a finite period of time, and finally raising the voltage to Vpass. Although FIG. 15 shows three intermediate voltages for the neighboring word lines WLn+1/WLn−1, more or less than three intermediate voltages can be used. In one embodiment, the difference between Vint 1 and Vpass is approximately two volts, with Vint 2 and Vint 3 equally spaced between Vint 1 and Vpass.

Figure 16:
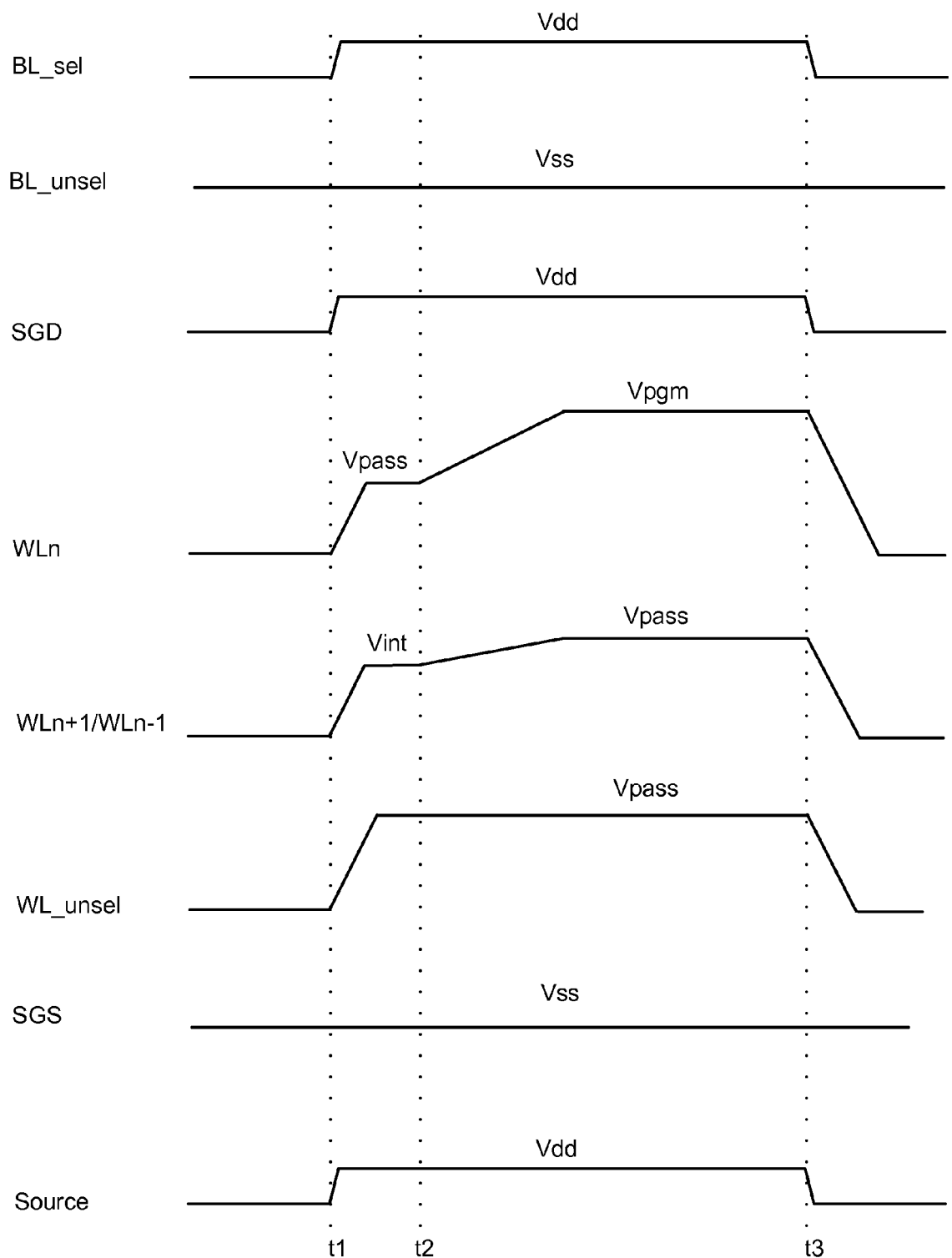

FIG. 16 is a timing diagram that depicts the behavior of various signals during another embodiment of Step 772 of the process depicted in FIG. 12. That is, the timing diagram of FIG. 16 shows the application of a programming pulse on the selected word line and the boosting voltages on the unselected word lines for another embodiment. The signals BL_sel, BL_unsel, SGD, WL_unsel, SGS, and Source behave in the same manner as FIG. 13. The difference between FIG. 16 and FIG. 13 is that at time t2, the selected word line WLn and the neighboring word lines WLn+1/WLn−1 are raised to their target voltages (Vpgm and Vpass, respectively) more gradually than in FIG. 13.

Figure 17:
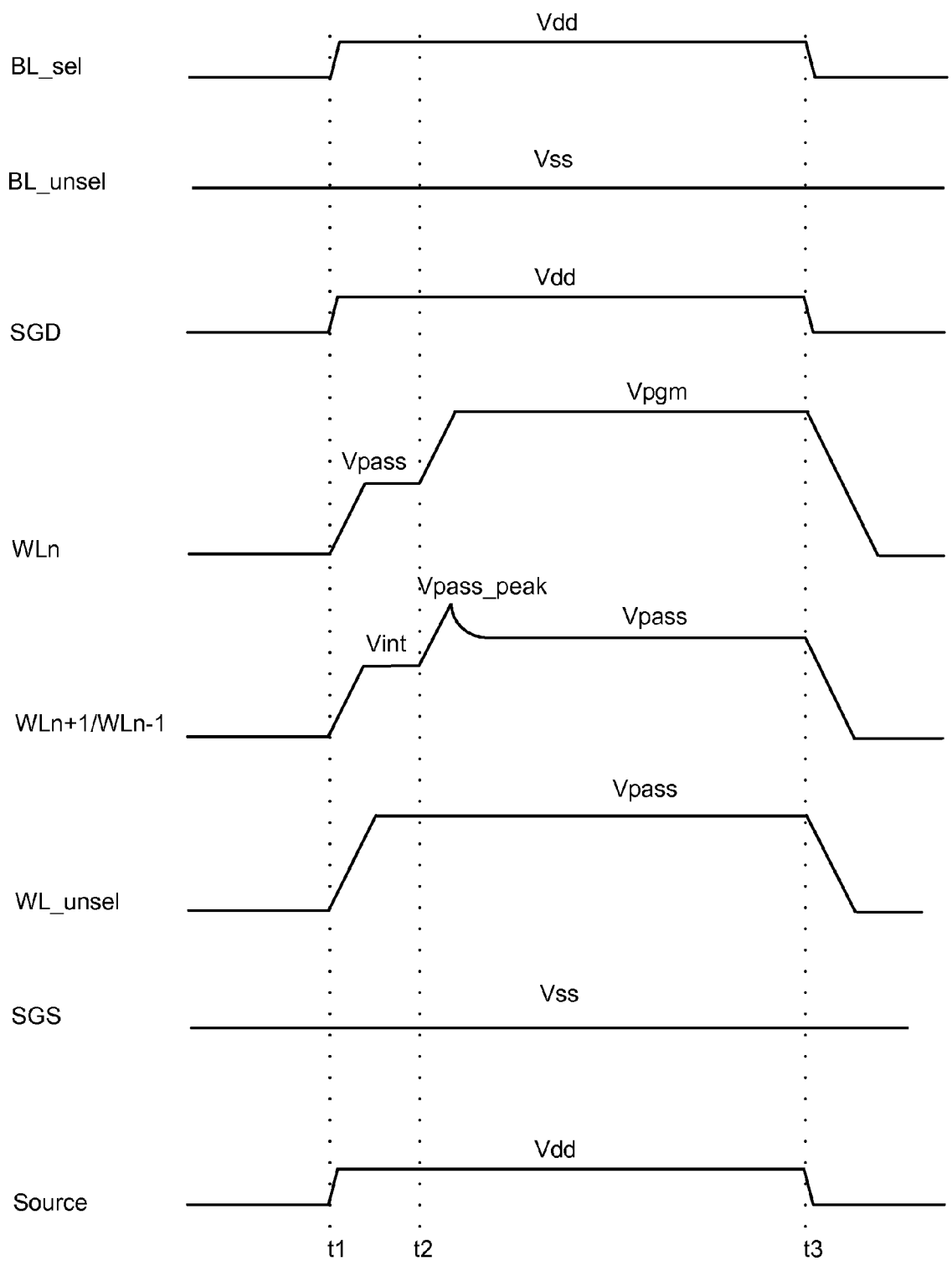

FIG. 17 is a timing diagram that depicts the behavior of various signals during another embodiment of Step 772 of the process depicted in FIG. 12. That is, the timing diagram shows the application of a programming pulse on the selected word line and the boosting voltages on the unselected word lines for another embodiment. The signals BL_sel, BL_unsel, SGD, WLn, WL_unsel, SGS and Source all behave the same as in FIG. 13. The difference between FIG. 17 and FIG. 13 is that the neighboring word lines WLn+1/WLn−1 are raised to a voltage higher than Vpass at time t2. For example, FIG. 17 shows WLn+1/WLn−1 being raised to Vpass_Peak a little after time t2. After reaching Vpass_Peak, then neighboring word lines are lowered down to Vpass. All the signals are lowered down to zero volts at time t3.

Figure 18:
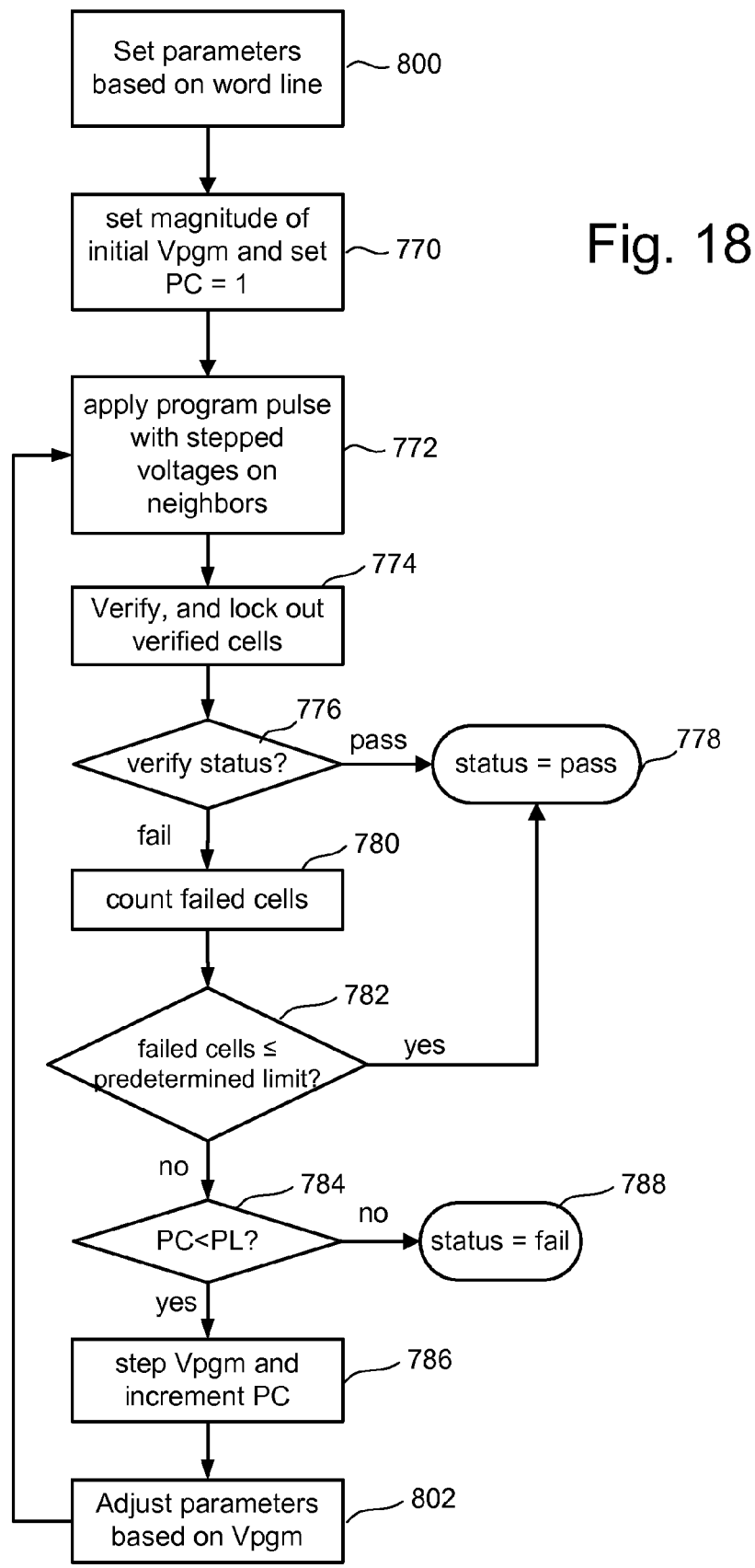
FIG. 18 is a flow chart describing one embodiment of a process for performing programming operations for non-volatile storage.

FIG. 18 is a flow chart describing one embodiment of a process for performing programming on memory cells connected to a common word line. The process of FIG. 18 can be performed one or multiple times during step 636 of FIG. 11. The process of FIG. 18 is similar to the process of FIG. 12. The steps in common between the processes of FIG. 12 and FIG. 18 have the same reference numbers. Differences between the two processes include that the process of FIG. 18 includes steps 800 and 802.

The embodiments of FIG. 18 contemplate two sets of features. One set of features includes varying the programming parameters based on what word line is being programmed. For example, step 800 (which is prior to step 770) includes setting various programming parameters based on which word line is being programmed. As discussed above, the programming process of FIG. 18 is used to program memory cells connected to a common word line. The programming process of FIG. 18 can be performed multiple times for a block including one or more times for each word line. Depending on which word line is being programmed, the various programming parameters can be changed. One example of a programming perimeter that can be changed is the Δ between Vint and Vpass. In some embodiments, near the end of a NAND string there is more space between word lines, while in the middle of the NAND string word lines are closer together. In cases where the distance between word lines is greater, the coupling could be weaker; therefore, the Δ may need to be larger. In some embodiments, word lines are thicker near the end of the NAND strings, while in other embodiments word lines are thicker in the middle of the NAND strings. Where the word lines are wider in thickness, the coupling could be greater; therefore, the Δ could be made smaller. Other factors can also be used when choosing to change the Δ based on the word line number. In addition to changing the Δ, the timing for when to raise the various word line voltages can change based on word line number. Therefore, at the outset of the process in FIG. 18 for a particular word line, the various parameters are set in step 800.

As discussed above, the programming process of FIGS. 12 and 18 include performing a set of cycles, with each cycle raising the program voltage Vpgm by step size (e.g. 0.1-0.5 volts). In some embodiments, Vpass can also be increased by the step size. In other embodiments, Vpass will not increase by the step size. In some embodiments, the Δ can increase each time Vpgm is increased. For example, in step 802 (performed after step 786 and prior to step 772), one or more of the parameters used for programming can be changed based on the magnitude of Vpgm. An example of a parameter that can be changed is the Δ between Vint and Vpass. In some embodiments, the Δ will change each time Vpgm changes. In other embodiments, Δ will change after a number of changes to Vpgm. In other embodiments, Δ will change after Vpgm has hit certain threshold magnitudes. In other embodiment, the Δ can be set as a mathematical function of Vpgm, or a mathematical function of Vpgm and word line number. Another embodiment, other data can be taken into account in a mathematical function used to set the Δ. In some embodiments of the process of FIG. 18, step 800 is performed and step 802 is not performed. In other embodiments, step 802 is performed and step 800 is not performed. In other embodiments, both steps 800 and 802 are performed. The steps of FIG. 18, other than steps 800 and 802, are the same as in FIG. 12 and are performed in the same manner. Any of FIGS. 13-17 can be used to implement Step 772 of FIG. 18.

One embodiment includes raising voltages for a set of word lines connected a group of connected non-volatile storage elements. The set of word lines include a selected word line, unselected word lines that are adjacent to the selected word line and other unselected word lines. After raising voltages for the set of word lines, the process includes further raising the selected word line to a program voltage and further raising the unselected word lines that are adjacent to the selected word line to one or more voltage levels concurrently with the raising the selected word line to the program voltage. The program voltage causes at least one of the non-volatile storage elements to experience programming.

One embodiment includes a plurality of non-volatile storage elements, word lines connected to the plurality of non-volatile storage elements, bit lines connected to the plurality of non-volatile storage elements, and one or more managing circuits in communication with the plurality of non-volatile storage elements via the word lines and the bit lines. For a programming process, the word lines include a selected word line, unselected word lines that are adjacent to the selected word line and other unselected word lines. The one or more managing circuits raise voltages for the word lines. After raising voltages for the word lines, the one or more managing circuits raise the selected word line to a program voltage and raise the unselected word lines that are adjacent to the selected word line to one or more voltage levels concurrently with the raising the selected word line to the program voltage.

One embodiment includes (a) raising a selected word line to an intermediate level for the selected word line, (b) raising word lines adjacent to the selected word line to one or more intermediate levels for the word lines adjacent to the selected word line, (c) raising other unselected word lines to one or more programming support levels that will reduce program disturb, (d) after steps (a)-(c), raising the selected word line to a current programming level, and (e) concurrently with step (d), raising the word lines adjacent to the selected word line by a step amount.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method for programming non-volatile storage including a set of word lines connected to a group of connected non-volatile storage elements, the set of word lines include a selected word line, a set of unselected word lines that are adjacent to the selected word line and a set of other unselected word lines, the method comprising:

raising the selected word line and the set of other unselected word lines to a first voltage during a first time period from a first time to a second time;

raising the set of unselected word lines that are adjacent to the selected word line to one or more second voltages different from the first voltage during the first time period;

raising the selected word line to a program voltage causing at least one of the non-volatile storage elements to experience programming during a second time period from the second time to a third time;

raising the set of unselected word lines that are adjacent to the selected word line to a third voltage during the second time period; and maintaining the set of other unselected word lines at the first voltage during the second time period.

2. The method of claim 1 further comprising:

the set of unselected word lines that are adjacent to the selected word line includes more than two word lines.

3. The method of claim 1 wherein raising the set of unselected word lines that are adjacent to the selected word line to one or more second voltages different from the first voltage during the first time period further comprises:

raising at least two unselected word lines in the set of unselected word lines that are adjacent to the selected word line to different second voltages different from the first voltage.

4. The method of claim 1, wherein the third voltage is the first voltage.

5. The method of claim 1 wherein the one or more second voltages are less than the third voltage.

6. The method of claim 1 further comprising:
increasing the magnitude of the program voltage for each of a number of programming cycles, a programming cycle including the first time period and the second time period;
increasing the first voltage and the one or more second voltages in each of the number of programming cycles based on an increase in the magnitude of the program voltage for the respective programming cycle.

7. The method of claim 1 further comprising:
increasing the magnitude of the program voltage for each of a number of programming cycles, a programming cycle including the first time period and the second time period;
a voltage value of the one or more second voltages staying constant and the first voltage increasing in each of the number of programming cycles based on an increase in the magnitude of the program voltage for the respective programming cycle.

8. The method of claim 1 wherein raising the set of unselected word lines that are adjacent to the selected word line to a third voltage during the second time period further comprises raising the set of unselected word lines that are adjacent to the selected word line in discrete voltage increments from the one or more second voltages to the third voltage over an amount of time within the second time period which is greater than a rise time for raising the selected word line from the first voltage to the program voltage.

9. The method of claim 1 wherein raising the set of unselected word lines that are adjacent to the selected word line to a third voltage during the second time period further comprises raising the set of unselected word lines that are adjacent to the selected word line from the one or more second voltages to the third voltage and raising the selected word line to the program voltage in the second time period with more gradual rise timing than used in the first time period.

10. A non-volatile storage apparatus, comprising:
a plurality of non-volatile storage elements;
word lines connected to the plurality of non-volatile storage elements, for a programming process the word lines include a selected word line, a set of unselected word lines that are adjacent to the selected word line and a set of other unselected word lines;
bit lines connected to the plurality of non-volatile storage elements; and
one or more managing circuits in communication with the plurality of non-volatile storage elements via the word lines and the bit lines, the one or more managing circuits raise the selected word line and the set of other unselected word lines to a first voltage during a first time period from a first time to a second time, raise the set of unselected word lines that are adjacent to the selected word line to one or more second voltages during the first time period, raise the selected word line to a program voltage causing at least one of the non-volatile storage elements to experience programming during a second time period from the second time to a third time, raise the set of unselected word lines that are adjacent to the selected word line to a third voltage during the second time period, and maintain the set of other unselected word lines at the first voltage during the second time period.

11. The apparatus of claim 10, wherein the third voltage is greater than the first voltage.

12. The apparatus of claim 10, wherein the one or more second voltages include the first voltage.

13. The apparatus of claim 10, wherein the first voltage is greater than the one or more second voltages.

14. The apparatus of claim 10 further comprises:
the one or more managing circuits raise the set of unselected word lines that are adjacent to the selected word line to a fourth voltage during the second time period.

15. The apparatus of claim 14 further comprising:
the one or more managing circuits raising the set of unselected word lines that are adjacent to the selected word line to the fourth voltage during the second time period before changing the set of unselected word lines that are adjacent to the selected word line to the third voltage during the second time period, and the fourth voltage is greater than the third voltage.

16. The apparatus of claim 10 further comprising:
the first voltage is a pass voltage and the second voltage is an intermediate voltage which is less than the pass voltage and the pass voltage is less than the program voltage, and the
the one or more managing circuits varying a voltage difference between the intermediate voltage and the pass voltage based on a spacing between at least one word line of the set of unselected word lines that are adjacent to the selected word line and another word line.

17. The apparatus of claim 10 further comprising:
the first voltage is a pass voltage and the second voltage is an intermediate voltage which is less than the pass voltage and the pass voltage is less than the program voltage, and the
the one or more managing circuits varying a voltage difference between the intermediate voltage and the pass voltage based on a thickness of at least one of the following: a word line in the set of unselected word lines that are adjacent to the selected word line or a word line in the set of other unselected word lines.

18. The apparatus of claim 10 further comprising:
the one or more managing circuits varying a timing for when to raise a voltage for a word line based on word line position.

19. The apparatus of claim 10, wherein:
the plurality of non-volatile storage elements are NAND flash memory devices;
the NAND flash memory devices include a selected NAND flash memory device;
the selected word line is connected to the selected NAND flash memory device; and
the selected NAND flash memory device has its threshold voltage changed in response to raising the selected word line to the program voltage.

* * * * *